United States Patent
Skendzic

(10) Patent No.: US 7,227,442 B2
(45) Date of Patent: Jun. 5, 2007

(54) PRECISION PRINTED CIRCUIT BOARD BASED ROGOWSKI COIL AND METHOD FOR MANUFACTURING SAME

(75) Inventor: Veselin Skendzic, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 124 days.

(21) Appl. No.: 11/096,474

(22) Filed: Apr. 1, 2005

(65) Prior Publication Data

US 2006/0220774 A1    Oct. 5, 2006

(51) Int. Cl.
*H01F 27/28* (2006.01)
(52) U.S. Cl. .................................................. 336/229
(58) Field of Classification Search .................. 336/65, 336/83, 200, 229, 232; 324/117 R, 127
See application file for complete search history.

(56) References Cited

U.S. PATENT DOCUMENTS

| | | | |
|---|---|---|---|
| 4,616,176 A | 10/1986 | Mercure et al. | |
| 4,709,205 A | 11/1987 | Baurand et al. | |
| 4,803,425 A * | 2/1989 | Swanberg | 324/173 |
| 4,810,954 A | 3/1989 | Fam | |
| 4,831,327 A | 5/1989 | Chenier et al. | |
| 5,012,218 A | 4/1991 | Haug et al. | |
| 5,055,816 A * | 10/1991 | Altman et al. | 336/200 |
| 5,272,460 A | 12/1993 | Baumgartner et al. | |
| 5,414,400 A * | 5/1995 | Gris et al. | 336/174 |
| 5,442,280 A | 8/1995 | Baudart | |
| 5,461,309 A | 10/1995 | Baudart | |
| 5,627,475 A | 5/1997 | Strosser | |
| 5,852,395 A | 12/1998 | Bosco et al. | |
| 5,917,316 A | 6/1999 | Bosco et al. | |
| 5,982,265 A | 11/1999 | Von Skarczinski | |

(Continued)

FOREIGN PATENT DOCUMENTS

EP    0573 350 B1    12/1993

(Continued)

OTHER PUBLICATIONS

Ramboz, John D., "Machinable Rogowski Coil, Design, and Calibration," IEEE Transactions on Instrumentation and Measurement, vol. 45, No. 2, Apr. 1996.

(Continued)

*Primary Examiner*—Tuyen T Nguyen
(74) *Attorney, Agent, or Firm*—Cook Alex McFarron Manzo Cummings & Mehler, Ltd.

(57) ABSTRACT

A precision printed circuit board based Rogowski coil is formed including a printed circuit board including a first layer and second layer. The printed circuit board further defines an aperture for receiving an electrical path therethough. A first return path is defined about the aperture on the first layer of the printed circuit board, and a second return path—parallel to the first return path—is defined about the aperture on the second layer of the printed circuit board. A plurality of radial paths defined on the first layer of printed circuit board extend between the aperture and the first return path. A plurality of radial paths defined on the second layer of the printed circuit board extend between the aperture and the second return path. Each first layer radial path is connected with an adjacent second layer radial path to form a generally toroidally-shaped winding.

20 Claims, 3 Drawing Sheets

U.S. PATENT DOCUMENTS

| | | |
|---|---|---|
| 6,094,044 A | 7/2000 | Kustera et al. |
| 6,184,672 B1 | 2/2001 | Berkcan |
| 6,215,296 B1 | 4/2001 | Arnoux et al. |
| 6,288,625 B1 | 9/2001 | Kaczkowski |
| 6,300,857 B1 | 10/2001 | Herwig |
| 6,313,623 B1 | 11/2001 | Kojovic et al. |
| 6,366,076 B1 | 4/2002 | Karrer et al. |
| 6,380,727 B1 | 4/2002 | Jitaru |
| 6,437,555 B1 | 8/2002 | Pioch et al. |
| 6,614,218 B1 | 9/2003 | Ray |
| 6,624,624 B1 | 9/2003 | Karrer et al. |
| 6,680,608 B2 | 1/2004 | Kojovic |
| 6,822,547 B2 * | 11/2004 | Saito et al. .................. 336/200 |
| 6,825,650 B1 | 11/2004 | McCormack et al. |
| 6,940,702 B2 | 9/2005 | Kojovic et al. |
| 7,009,486 B1 * | 3/2006 | Goeke et al. ............... 336/229 |
| 7,106,162 B2 * | 9/2006 | Saito ......................... 336/229 |
| 7,109,838 B2 * | 9/2006 | Brennan et al. ............. 336/200 |
| 2003/0090356 A1 | 5/2003 | Saito et al. |
| 2004/0008461 A1 | 1/2004 | Kojovic et al. |
| 2004/0012901 A1 | 1/2004 | Kojovic et al. |
| 2004/0178875 A1 | 9/2004 | Saito |
| 2005/0156587 A1 | 7/2005 | Yakymyshyn |

FOREIGN PATENT DOCUMENTS

| | | |
|---|---|---|
| EP | 0587491 B1 | 3/1994 |
| EP | 0652441 A1 | 5/1995 |
| EP | 0808460 B1 | 11/1997 |
| EP | 0889490 A2 | 1/1999 |
| EP | 0889490 A3 | 1/1999 |
| GB | 2034 487 A | 6/1980 |
| GB | 2259150 A | 3/1993 |
| WO | WO 00/72027 A1 | 11/2000 |

OTHER PUBLICATIONS

W.Z. Fam, A Combined Current and Voltage Sensor for Metering and Protection in High Voltage Power Systems, Canadian Conf. on Electrical Computer Engineering, p. 145-151, 1994.

* cited by examiner

PRECISION PRINTED CIRCUIT BOARD BASED ROGOWSKI COIL AND METHOD FOR MANUFACTURING SAME

BACKGROUND OF THE INVENTION

The present invention concerns Rogowski coils. More particularly, the present invention concerns a printed circuit board based Rogowski coil and manner of making the same.

Rogowski coils are electrical devices which measure of magnetic fields and electrical currents. They have been researched over the past century and are well known to the scientific literature. Their origin traces to the invention circa 1912 of the Rogowski coil by W. Rogowski and W. Steinhousen. The device is useful for measuring electrical currents and operates on the basis of a magnetic field integration performed across a closed contour being equal to the current flowing through the contour. The coil provides a voltage output proportional to the time derivative of the current (di/dt), rather than a current output like other traditional current transformers (e.g., the iron core current transformer of FIG. 2).

Rogowski coils are popular because of their dynamic range and linearity. However, though theoretical requirements are known, manufacturers are still attempting to achieve a high quality coil that is both economical to manufacture and at the same time, capable of providing precise current measurements. The device (coil) should be insensitive to external influences, insensitive to the measured primary conductor position, and retain high precision (in the order of 0.3% or better) over its lifetime and across a wide temperature range (nominally −40 to 70 degrees Centigrade).

One known approach to making a Rogowski coil involves using a printed circuit. U.S. Pat. No. 5,414,400 describes a Rogowski coil implemented on a printed circuit plate provided with a circular cut-out. The coil is implemented by metal deposits on each of the two faces of the plate extending along radii, with electrical connections between the radii on one face and those on the opposite face being achieved via plated-through holes passing through the thickness of the plate. The patent fails to provide adequate means for external field cancellation due to inadequate handling of the coil return path.

U.S. Pat. No. 5,442,280 describes a method for manufacturing a printed circuit board-based Rogowski coil. The disclosed geometry provides very high turn density resulting in very high sensitivity. While high sensitivity is very desirable when measuring low frequency currents (50/60 Hz power system related), the patent fails to provide adequate means for external field cancellation. This problem is reported in U.S. Pat. No. 6,624,624 and is caused by inadequate handling of the coil return path.

A similar problem applies to the design reported in U.S. Pat. No. 6,313,623 (by Kojovic, et al.) in which two closely spaced coils with counter rotation are used to perform partial return path compensation.

Further attempts to design precision Rogowski coils are described in U.S. Pat. No. 6,624,624. Attempts to provide improved return path cancellation described in this patent results in significantly reduced coil densities, making the design less appropriate for low frequency (at about 50/60 Hz) current measurement applications. In addition, although improved, all reported geometries suffer from Z-axis (board thickness) related sensitivity effects with an error path normally offset in the direction of the Z-axis (board thickness).

J. D. Ramboz in "Machinable Rogowski Coil, Design and Calibration," IEEE Transactions on Instrumentation and Measurement, Vol. 45, No. 2, (April 1996) pp 511–15 reviews traditional designs for Rogowski coils and discusses a "machinable" Rogowski coil constructed using machinable ceramic material to make a toroidal coil with a rectangular cross section. A thin, electrically conductive coating is then applied to the coil, totally encapsulating the ceramic core. Next, thin lines of the conductive material are removed by laser machining methods in a pattern which leaves coils as bands of conductive material located radially around the core. Each turn or band is connected to the next turn by a suitable indexing.

U.S. patent application Ser. No. 10/282,226 for "Current Transformer" describes a configuration whereupon a Rogowski Coil is implemented on a multilayer board. The patent provides a means for external field cancellation; however, a coil return path is centrally situated among the radial paths emanating from the aperture. Accordingly, this centrally situated return path necessitates at least a 4-layer printed circuit board, which must be manufactured at a higher cost.

An object of the present invention is to provide a precision printed circuit board Rogowski coil which provides excellent external field cancellation. It is further an object of this invention to provide for improved coil manufacturability, control of the coil resistance, compensation of the manufacturing variation of the coil gain, and temperature compensation.

These and other desired benefits of the preferred embodiments, including combinations of features thereof, of the invention will become apparent from the following description. It will be understood, however, that a process or arrangement could still appropriate the claimed invention without accomplishing each and every one of these desired benefits, including those gleaned from the following description. The appended claims, not these desired benefits, define the subject matter of the invention. Any and all benefits are derived from the multiple embodiments of the invention, not necessarily the invention in general.

SUMMARY OF THE INVENTION

A precision printed circuit board based Rogowski coil according to certain aspects of the present invention includes a printed circuit board including a first layer and second layer. The printed circuit board further defines an aperture for receiving an electrical path therethough. A first return path is defined about the aperture on the first layer of the printed circuit board, and a second return path, parallel to the first return path, is defined about the aperture on the second layer of the printed circuit board.

A plurality of radial paths defined on the first layer of printed circuit board extend between the aperture and the first return path. A plurality of radial paths defined on the second layer of the printed circuit board extend between the aperture and the second return path. Each first layer radial path is connected with an adjacent second layer radial path to form a generally toroidally-shaped winding. Various structures and methods address return path cancellation, gain and thermal compensations.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

BRIEF DESCRIPTION OF THE DRAWINGS

In describing preferred embodiments of the present invention, reference is made to accompanying drawings wherein like parts bear similar reference numerals and wherein.

DESCRIPTION OF MULTIPLE EMBODIMENTS

The multiple embodiments of this invention relate to a precision printed circuit board based Rogowski coil. This present invention printed circuit board based Rogowski coil may be used to measure magnetic fields and electrical currents. In one example of measuring electrical currents, the multiple embodiments may be used to enable low-voltage devices, such as power system control or protective devices, to measure and handle large currents flowing in a high-voltage power system.

Generally, power system control or protective devices are used for protecting, monitoring, controlling, metering and/or automating electric power systems and associated transmission lines. These power system control or protective devices may include protective relays, RTUs, PLCs, bay controllers, SCADA systems, general computer systems, meters, and any other comparable devices used for protecting, monitoring, controlling, metering and/or automating electric power systems and their associated transmission lines. Although the embodiments described herein are preferably associated with protective relays, it is contemplated that the embodiments may also be associated with any suitable high current measurement, control or protective devices.

Figure 1:
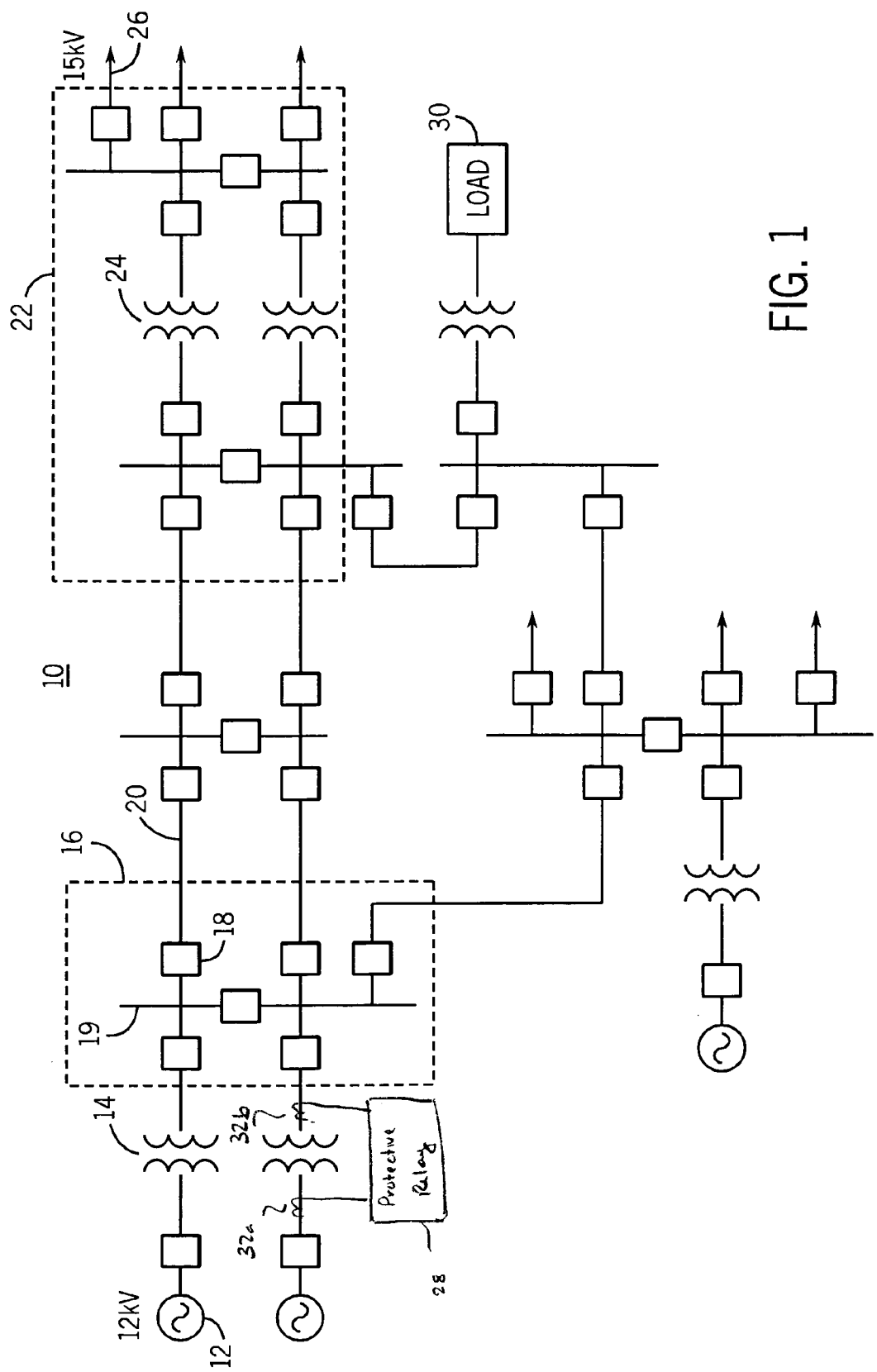
FIG. 1 is a schematic diagram of a power system that may be utilized in a typical metropolitan area.

More specifically, FIG. 1 is a schematic diagram of a power system 10 that may be utilized in a typical metropolitan area. As illustrated in FIG. 1, the power system 10 includes, among other things, a generator 12 configured to generate three-phase sinusoidal waveforms at, for example, 12 kV, a step-up transformer 14 configured to increase the 12 kV sinusoidal waveforms to a higher voltage such as 345 kV, and a first substation 16 including a number of circuit breakers 18 and transmission lines 20 interconnected via a first substation bus 19. The first substation 16 provides the higher voltage sinusoidal waveforms to a number of long distance transmission lines such as a transmission line 20. At the end of the long distance transmission line 20, a second substation 22 includes a step-down transformer 24 to transform the higher voltage sinusoidal waveforms to a lower voltage (e.g., 15 kV) suitable for distribution via a distribution line 26 to various end users and loads.

As previously mentioned, the power system 10 includes protective devices and procedures to protect the power system elements from abnormal conditions. Some of the protective devices and procedures act to isolate corresponding protected elements (e.g., the transmission line 20) of the power system 10 upon detection of short circuit or fault. Other types of protective devices used in the power system 10 provide protection from thermal damage, mechanical damage, voltage sags and transient instability.

The protective devices and procedures utilize a variety of protective relay logic schemes to determine whether a fault or other problem exists in the power system 10. For example, some types of protective relays utilize a current differential comparison to determine whether a fault exists in the protected element. Other types of protective relays compare the magnitudes of calculated phasors representative of the three-phase sinusoidal waveforms to determine whether a fault exists. Frequency sensing techniques and harmonic content detection is also incorporated in protective relays to detect fault conditions. Similarly, thermal model schemes are utilized by protective relays to determine whether a thermal problem exists in the protected element.

For example, protection for the generator 12 may be provided by a generator differential protective relay (e.g., ANSI 87G), protection for the transformer 14 may be provided by a transformer overcurrent relay or a transformer differential protective relay (e.g., ANSI 87T) and protection for the circuit breaker 16 may be provided by a breaker failure relay. Similarly, protection for the transmission line 20 may be provided by a phase and ground distance relay or a line current differential relay (e.g., ANSI 87L), and protection of the distribution line 26 may be provided by a directional overcurrent and reclosing relay. Many protective relay logic schemes are possible.

Figure 2:
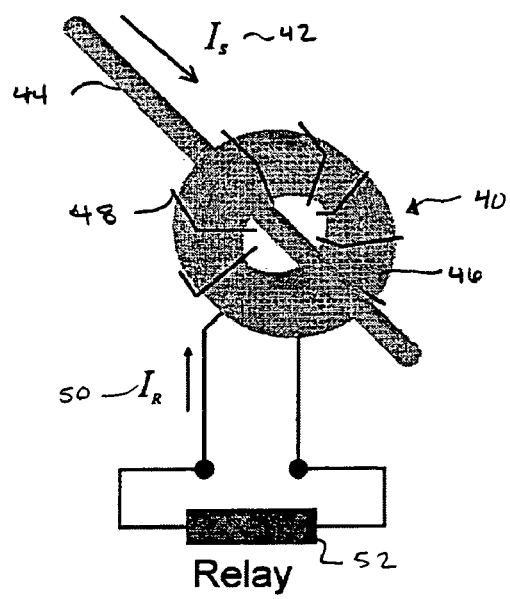
FIG. 2 is prior art diagram of a traditional iron core current transformer associated with a protective relay for measuring the current within an electrical path.

In almost all cases however, step-down current and voltage transformers are used to connect the protective relays to their corresponding higher power protected elements. The resulting lower secondary currents and voltages can be readily monitored and/or measured by the protective relays to determine corresponding phasors that are used in the various overcurrent, voltage, directional, distance, differential, and frequency protective relay logic schemes. These protective devices may be associated with a current transformer (e.g., a traditional iron core current transformer as illustrated in FIG. 2 or the present invention device). For example, a protected element of the power system 10 may be coupled to a current differential relay 28, allowing each of the primary currents to be "measured" via a current transformer 32a as a proportional secondary current from a respective current transformer 32b by the current differential relay. When the protected element has a short circuit, or is faulted, the sum of the proportional secondary currents (proportional to the sum of the primary currents) will be substantially different than zero and a tripping signal may result.

FIG. 2 illustrates a general system diagram of a prior art current transformer 40, which reduces the large system current ($I_S$) 42 flowing through a transmission line 44 of a high-voltage system. The FIG. 2 prior art current transformer 40 may be used in place of the current transformers 32a, 32b of FIG. 1. The FIG. 2 current transformer 40 includes an iron core 46 wherein a transmission line 44 may advance therethrough. The current transformer 40 further includes a secondary winding 48 having a number of turns (N) about the iron core 46. This current transformer arrangement reduces the large system current ($I_S$) 42 to a low-current resulting current ($I_R$) 50, wherein a low-voltage device, i.e. relay 52, may safely derive the large system current ($I_S$) 42. More specifically, the resulting current ($I_R$) is generally equal to the system current-($I_S$) divided by the number of turns (N) of the secondary winding.

The prior art current transformer 40 of FIG. 2 can be replaced by a traditional or the present invention Rogowski coil to measure the current flowing through transmission line 44. The present invention Rogowski coil may measure current flowing through any electrical path. An electrical path is defined herein as any medium or means for carrying or transmitting electricity. For example, an electrical path may be an electrical power transmission line 44 or other such transmission lines in an electrical power system. The electrical path may further be in the form of a metallic conductor or other known medium or means. In yet another example, an electrical path may further be a beam of ionized particles (e.g., electron beam, plasma beam).

In implementing a traditional or the present invention Rogowski coil in place of a current transformer, the large system current ($I_S$) would still be reduced based on the cross sectional area and the number of turns of the Rogowski coil secondary winding. In this way, an associated low-voltage device, i.e. relay 52, may safely measure the large system current ($I_S$) 42. Because traditional and the present invention Rogowski coils include an air core rather than an iron core as used in traditional current transformers, traditional and the present invention Rogowski coils have a low inductance and can respond to rapidly changing currents. Also, because they have no iron core to saturate, traditional and the present invention Rogowski coils are highly linear even when subjected to large currents. Accordingly, traditional and the present invention Rogowski coils provide a manner for measuring the amount of current flowing through the center of the coil, while at the same time being insensitive to all currents passing outside of the coil. Therefore, other traditional Rogowski coils and the device in accordance with the multiple aspects of the present invention may be used in place of the FIG. 2 prior art current transformer 40 or the current transformers 32a, 32b of FIG. 1.

Figures 3, 4:
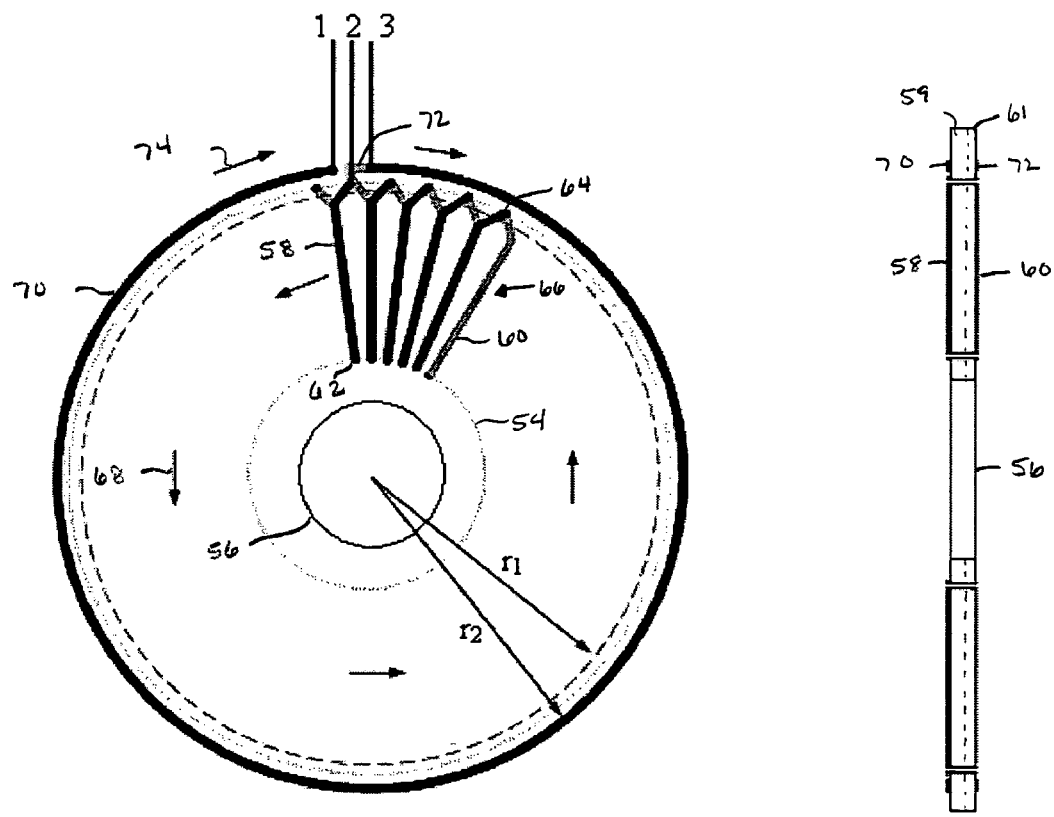
FIG. 3 is a diagram of the geometry for a printed circuit board based Rogowski coil in accordance with an aspect of the present invention.
FIG. 4 is a diagrammic side view of the FIG. 3 geometry for a printed circuit board based Rogowski coil in accordance with an aspect of the present invention.

FIGS. 3 and 4 illustrate a first embodiment Rogowski coil geometry for a precision printed circuit board based Rogowski coil in accordance with an aspect of the present invention. The coil geometry includes a radial path emanating region 54, wherein an aperture 56 may be defined therein. The aperture 56 is sized and shaped for receiving an electrical path therethrough. For example, the electrical path may be in the form of a transmission line 44 (e.g. metallic conductors, or be contained within a beam of ionized particles (e.g., electron beam, plasma beam)) as discussed with regard to FIG. 2. The radial path emanating region 54 and aperture 56 defined herein is circular for illustrated purposes. The radial path emanating region 54 and aperture 56 may further be generally circular, generally rectangular, or otherwise, e.g. oval, oblong, or some other shape.

Emanating from the radial path emanating region 54 is a first set of radial paths 58 situated on a first layer 59. Also emanating from the radial path emanating region 54 is a second set of radial paths 60 which is situated below the first set of radial paths 58 on a second layer 61. Each first layer path is connected (e.g., at 62, 64) with an adjacent second layer radial path to form a generally toroidally-shaped winding 66. The interconnection is preferably achieved by means of multiple vias between the first and second layers of the printed circuit board. Preferably, each radial path on either layer has a uniform pitch around the radial path emanating region 54. The radial paths 58, 60 are further connected such that they advance in a counter-clockwise fashion as shown at 68.

The term "toroid" often connotes a "doughnut" shape but the present invention does not require a "doughnut" shape for the winding 66. It will be understood from the illustrative drawings and the present description that a cross section cut through a diameter or radius of winding 66 can be either generally circular, generally rectangular, or otherwise, e.g. oval, oblong, or some other shape. That is, winding 66 may have the geometric shape of a solid formed by rotating (orbiting) a closed form, be it a circle, square, rectangle, oval, oblong, or irregular shaped closed line, around 360 degrees of a circle. In this respect, with the multiple geometric shapes possible, the winding is "generally toroidally-shaped."

Return path cancellation can be achieved in various ways. One way is to provide a first return path 70 on the first layer 59 and a second return path 72 on the second layer 61. The return paths 70, 72 null out, to the extent possible, the external magnetic field influence effect of the toroidally-shaped winding 66. Thus, if the coil advances around the radial path emanating region 54 in a counter-clockwise direction as shown at 68, then return paths 70 and 72 must be wound in the clockwise direction as shown at 74, or vice versa.

The two return paths 70 and 72 are connected in parallel by means of multiple vias spaced at regular intervals around the entire length of the return path. This interconnection is clearly shown in FIG. 4. Consequently, this parallel connection results in a single "effective" return path, being positioned half way into the thickness of the board. By being positioned inside the board thickness, the effective return path can match the effective position of the coil advancement path, thereby achieving effective, if not optimal, return path cancellation. In yet another benefit, the parallel return path construction allows for a printed circuit board arrangement having only 2 layers, as opposed to other traditional multilayer boards (e.g., a 4-layer printed circuit board).

The radial paths 58,60 and return paths 70, 72 may be formed onto to a printed circuit board using well known printed circuit board manufacturing methods. In one embodiment, a resin impregnated glass fiber core may be provided having opposing flat surfaces. These opposing flat surfaces are fully covered with thin copper foil. The copper foil surface is then coated with a photosensitive masking material. The desired design, such as those described in the embodiments herein, is photo imaged onto both sides, and then developed and removed in select areas to expose the underlying copper. Exposed copper would be etched away, leaving the desired conducting traces. A similar process is used to metallize "vias" (holes) interconnecting the two opposing layers (e.g. interconnecting the parallel return paths or radial paths).

Figure 5:
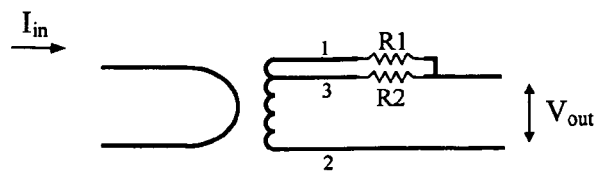
FIG. 5 is an electrical circuit diagram of a resistive network applicable to Rogowski coils of the present invention for effective return path compensation.

Turning now to FIGS. 3, 4, and 5, to make the Rogowski coil more precise, the external magnetic field cancellation effectiveness of the return path 70,72 may be improved by the addition of a resistive network. FIG. 5 provides a partial view of the coil geometry for a Rogowski coil of FIGS. 3 and 4 embodied in a precision printed circuit board in accordance with an aspect of the present invention. Electrically, as shown on FIG. 3, the coil has points 1, 2, and 3.

Point 1 is the end of the return path 70. Point 2 is the beginning of the main coil produced by the connection of the first and second set of radial paths 58, 60. Point 3 represents the point at which the main coil connects to the return path.

The main coil will have an effective advancement path radius represented by $r_1$ in FIG. 3, whereas $r_2$ denotes the actual radius of the return loop. The return loop radius $r_2$ is generally larger than effective radius $r_1$ with the result that return path cancellation is suboptimal. Other parameters, namely the z-axis position and concentricity of the two paths ("front" and "back" of the toroidally-shaped winding 66) are well matched, making it possible to use a passive circuit based technique for return path effective diameter (radius) adjustment.

An effective diameter adjustment technique is shown in FIG. 5. The basic mathematical relationship between individual coil outputs for a magnetic field parallel to the axis of the toroidally-shaped winding 66 is given in Equation 1 below, where the notation $V_{Desired}$ is used to indicate the coil output resulting from the main coil advancement path governed by the effective radius $r_1$. Since radius $r_2$ is different than $r_1$, the return path compensation coil output $V_{Actual}$ will in general be different, and the ratio between the voltages will be proportional to the ratio of the squares of the two radii.

By advantageously positioning the return coil on the outside of the effective advancement path radius $r_1$ of the main coil ($r_2>r_1$), it is possible to ensure that $V_{Actual}>V_{Desired}$ making it possible to use a simple resistive divider (highly reliable passive network) to match exactly the desired compensation path output to the actual output of the coil advancement path. The resistive divider is used to effectively reduce radius $r_2$ with the objective of matching it to the radius $r_1$.

$$\frac{V_{Desired}}{V_{Actual}} = \frac{r_1^2}{r_2^2} \quad (1)$$

Equation (2) below describes the matched state relationship. Simple algebraic manipulations allow equations (1) and (2) to be used to determine the ratiometric relation between gain matching resistors R1 and R2. The final relation is given in equation (3). It will be understood that by changing the coil geometry (thus affecting the effective radii $r_1$ and $r_2$ by making $r_1>r_2$), it may become necessary to attenuate the output of the main coil instead of the return path output. Such modification is anticipated and does not deviate from the spirit of this invention.

$$V_{Desired} = \frac{V_{Actual} \times R2}{R1 + R2} \quad (2)$$

$$R1 = \frac{(r_2^2 - r_1^2)}{r_1^2} \times R2 \quad (3)$$

The exact value of matching resistors is less significant than their ratio, with typical values ranging between about 1 and about 1000 ohms. If advantageous, the resistor value can be selected to match the attached transmission line impedance. The resistor value should be kept below about 1000 ohms to reduce the resistor-generated noise contribution. The resistive network can be placed in close proximity of the coil, by soldering resistors R1 and R2 directly to the return (compensation) coil output. If required, a separate set of conductors can be used to bring both the output of the main coil and the return coil to a remote location (up to about 100 m) equipped with resistors R1 and R2.

Figure 6:
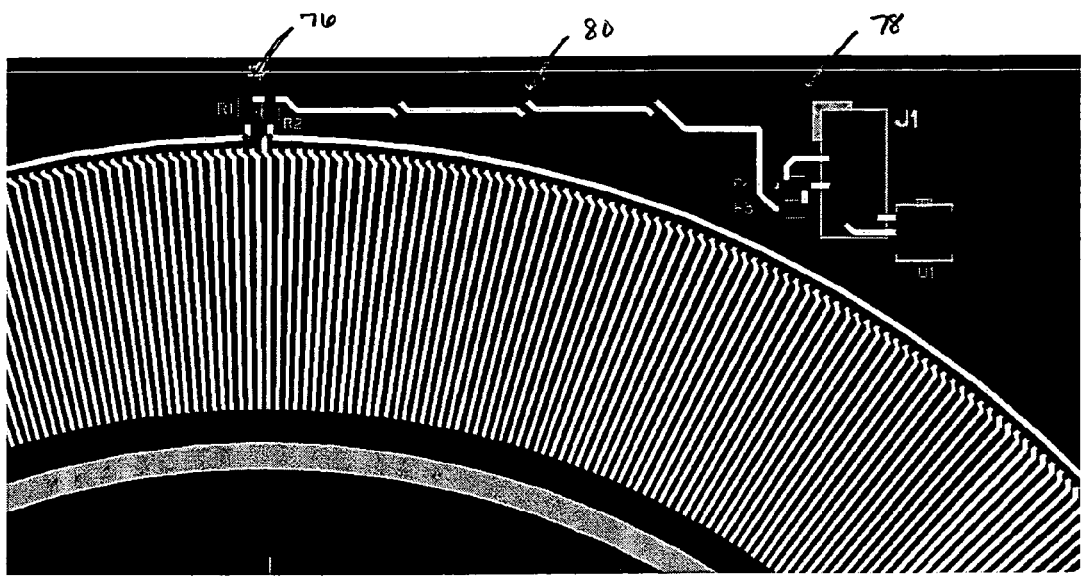
FIG. 6 is a partial view diagram of a printed circuit board based Rogowski coil including the geometry of FIG. 3, the resistive network for return path compensation of FIG. 5 and temperature and gain compensation of FIG. 7.

FIG. 6 illustrates one manner of incorporating the resistors R1 and R2 on a printed circuit board. For example, in this case, resistors R1 and R2 are located on the printed circuit board. These resistors are shown generally, as similar resistors may instead be located remotely, and connected in accordance with the discussion of FIG. 5. The radial paths 58, 60 and return paths 70, 72 may be formed onto to the printed circuit board using various known methods. For example, by using photolithography, followed by etching, routing, lamination and hole metallization. It will be understood, furthermore, that the printed circuit board based Rogowski coil need not be produced using this method but can be manufactured according to any known technology such as molding, machining, and other forms of manufacturing well known in that art.

Through use of various known substrates such as glass reinforced epoxy resin, PTFE, Ceramic (FR-4, FR-5, Ultralam 2000, RT/Duroid), a high quality printed circuit board based Rogowski coil can be manufactured economically and still be essentially insensitive to external influences, insensitive to measured primary conductor position, and will retain high precision on the order of about 0.3% or better over its lifetime across a wide operating temperature range, illustratively from about −40° C. to about 70° C.

Nevertheless, if there are effects of temperature, temperature and gain compensation techniques are applicable to the toroidally-shaped winding according to the present invention. Return path cancellation as set forth above is used to compensate for the effect of coil advancement. An actual Rogowski coil implementation will exhibit additional sources of error. The most pronounced additional errors are: (1) temperature dependence of the coil output; (2) individual coil gain differences caused by the manufacturing process variations; and (3) capacitive coupling based errors from neighboring high voltage conductors.

Temperature dependence is present if the material used to form the toroidally-shaped winding for the Rogowski coil changes physical dimensions (expands and contracts) with temperature variations. It is very common for materials to expand with increasing temperature, causing in turn an increase of the Rogowski cross sectional area. Since the Rogowski coil output is a direct function of the cross sectional area, as given in Equation(4) below, it will increase as the material used to support the coil expands.

$$V_{(t)} = \mu_0 S \frac{di}{dt} \quad (4)$$

where: $\mu_0$=permeability of free space( $4\pi*10^{-7}$ Vs/Am)
S=total cross sectional area of the coil
i=measured primary current
t=time Careful selection of core material is used to minimize the thermal expansion coefficient, thus significantly reducing the temperature dependency of the coil gain. Preferred printed circuit board materials have been mentioned above. While dimensionally stable materials (with a coefficient of thermal expansion ("CTE")<about 5 ppm/° C.) are available, material cost increases with tighter CTE specifications. If the coil is to be formed on a material with a non-zero (non-negligible) CTE such as FR-4, it will be desirable to provide localized compensation for temperature effects.

Referring to FIG. 6, such compensation can be achieved by adding a thermally sensitive compensation resistor (R3) and combining it with a temperature stable resistor (R4). Thermo sensitive resistors are typically built using a high quality metal film process and have a well defined temperature coefficient (about 1000 to about 4700 ppm/c, Panasonic, ERAW series or similar) When combined, resistors R3 and R4 form a temperature compensating divider, which is added to the main coil output. By carefully adjusting individual value of the resistors R3 and/or R4, it is also possible to compensate for the individual gain variation among multiple coils. Gain compensation is normally performed during coil manufacturing (factory calibration) by trimming one or both legs of the output divider. Individual coil gain is determined by passing known electrical current through the coil opening, and recording the voltage present at the coil output, or by comparing the coil output with a known calibration artifact.

Figure 7:
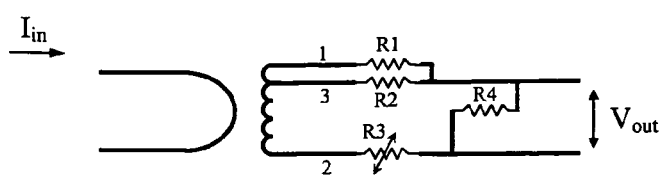
FIG. 7 is an electrical circuit diagram of a resistive network applicable to Rogowski coils of the present invention for return path, temperature and gain compensation.

FIG. 7 illustrates one manner of incorporating temperature and gain compensation on a printed circuit board as shown generally at 78. Shielding may be accomplished by laminating additional layers of prepreg/copper foil material on the outside of the coil thus forming a 4 layer board with buried vias. In order to eliminate unwanted error loops, two conductors are run in parallel and are periodically transposed, as shown at 80. Although exact number of transpositions and length of individual straight segments are not of great significance, it is preferable that both conductors span one half of the total distance on each side of the board thus forming a fully transposed and symmetric pattern.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

The invention claimed is:

1. A device for sensing current in an electrical path, comprising:
   a printed circuit board including a first layer and a second layer, the printed circuit board defining an aperture for receiving the electrical path therethrough,
   a first return path defined about the aperture on the first layer of the printed circuit board,
   a second return path defined about the aperture on the second layer of the printed circuit board, the second return path further being connected in parallel to the first return path,
   a plurality of radial paths defined on the first layer of the printed circuit board, the first layer paths each extending between the aperture and the first return path, and
   a plurality of radial paths defined on the second layer of the printed circuit board, the second layer radial paths each extending between the aperture and the second return path, wherein each first layer radial path is connected with an adjacent second layer radial path to form a generally toroidally-shaped main coil winding.

2. The device of claim 1, further comprising a resistive network for external field cancellation electrically coupled to said first and second return paths and said main coil winding.

3. The device of claim 2, wherein said resistive network includes a resistor ratio adjustable to achieve external field cancellation.

4. The device of claim 3, said aperture having a center, said first and second return paths having a select radius from the center of said aperture, and wherein said first and second layer radial paths form an effective advancement path having a select radius from the center of said aperture, wherein the resistor ratio adjusted to achieve external field cancellation is in accordance with the following equation:

$$R1 = \frac{(r_2^2 - r_1^2)}{r_1^2} \times R2,$$

wherein R1 and R2 are selected gain matching resistors, $r_1$ is the effective advancement path radius, and $r_2$ is the radius of the return paths.

5. The device of claim 1, wherein said first and second layer radial paths form an effective advancement path having a select radius from the center of said aperture.

6. The device of claim 1, said connection of first layer and second layer radial paths constituting a main coil advancing in a general direction, and said first and second return paths wrapped on top of said main coil in a reverse direction of advancement as said main coil winding.

7. The device of claim 1, further including a resistive network for temperature compensation electrically coupled to said first and second return paths and said main coil winding.

8. The device of claim 1, further including a resistive network for gain compensation electrically coupled to said first and second return paths and said main coil winding.

9. The device of claim 1, further including shielding material on top of said first and second layers of the printed circuit board.

10. The device of claim 1, further comprising a conductor connected to one of said radial paths, a conductor connected to said first return path, and a conductor connected to said second return path.

11. The device of claim 10, wherein each of said conductors are situated on a printed circuit board.

12. The device of claim 11, wherein said conductors are transposed to eliminate error.

13. The device of claim 10, further comprising a resistive network electrically coupled to said conductors for external field cancellation.

14. The device of claim 10, further comprising a resistive network electrically coupled to said conductors for temperature compensation.

15. The device of claim 10, further comprising a resistive network electrically coupled to said conductors for gain compensation.

16. The device of claim 10, wherein the second return path further being connected in parallel to the first return path through a plurality of vias between the first and second layers of the printed circuit board.

17. The device of claim 10, wherein each first layer radial path is connected to an adjacent second layer radial path through a via between the first and second layers of the printed circuit board.

18. The device of claim 1, wherein the electrical path is a conductor.

19. The device of claim 1, wherein the electrical path is a beam of ionized particles.

20. The device of claim 1, wherein the electrical path is an electrical transmission line.

* * * * *